(12) United States Patent
Sreenivasan et al.

(10) Patent No.: US 8,850,980 B2
(45) Date of Patent: Oct. 7, 2014

(54) TESSELLATED PATTERNS IN IMPRINT LITHOGRAPHY

(75) Inventors: Sidlgata V. Sreenivasan, Austin, TX (US); Philip D. Schumaker, Austin, TX (US); Ian M. McMackin, Austin, TX (US)

(73) Assignee: Canon Nanotechnologies, Inc., Austin, TX (US)

( * ) Notice: Subject to any disclaimer, the term of this patent is extended or adjusted under 35 U.S.C. 154(b) by 786 days.

(21) Appl. No.: 11/694,612

(22) Filed: Mar. 30, 2007

(65) Prior Publication Data

US 2007/0247608 A1    Oct. 25, 2007

Related U.S. Application Data

(60) Provisional application No. 60/788,807, filed on Apr. 3, 2006, provisional application No. 60/862,480, filed on Oct. 23, 2006.

(51) Int. Cl.
| | |
|---|---|
| B29C 59/02 | (2006.01) |
| H01L 21/02 | (2006.01) |
| G03F 9/00 | (2006.01) |
| B82Y 40/00 | (2011.01) |
| G03F 7/00 | (2006.01) |
| G03B 27/42 | (2006.01) |
| G03B 27/62 | (2006.01) |
| B82Y 10/00 | (2011.01) |

(52) U.S. Cl.
CPC .............. *G03B 27/62* (2013.01); *G03F 9/7084* (2013.01); *B82Y 40/00* (2013.01); *G03F 7/0002* (2013.01); *G03F 9/7076* (2013.01); *G03B 27/42* (2013.01); *G03F 9/7042* (2013.01); *G03F 9/00* (2013.01); *B82Y 10/00* (2013.01)
USPC .............. 101/483; 101/485; 425/385; 216/44

(58) Field of Classification Search
USPC .............. 216/44, 39; 356/121; 101/368, 483, 101/485, 490; 425/385
See application file for complete search history.

(56) References Cited

U.S. PATENT DOCUMENTS

| | | | |
|---|---|---|---|
| 4,022,855 | A | 5/1977 | Hamblen |
| 4,070,116 | A | 1/1978 | Frosch et al. |
| 4,208,240 | A | 6/1980 | Latos |
| 4,364,971 | A | 12/1982 | Sack et al. |

(Continued)

FOREIGN PATENT DOCUMENTS

| | | |
|---|---|---|
| JP | 3-32888 | 2/1981 |
| JP | 1-196749 | 8/1989 |

(Continued)

OTHER PUBLICATIONS

Johnson et al., Advances in Step and Flash Imprint Lithography, SPIE Microlithography Conference Feb. 23, 2003.

(Continued)

*Primary Examiner* — Leslie J Evanisko
(74) *Attorney, Agent, or Firm* — Cameron A. King

(57) ABSTRACT

The present invention is directed towards a choice of the shape of the patterned fields for Level 0 (patterned by imprint or photolithography or e-beam, etc.) and Level 1 (patterned by imprint) such that these shapes when tessellated together eliminate the open areas causes by the moats.

7 Claims, 7 Drawing Sheets

(56) References Cited

U.S. PATENT DOCUMENTS

| | | |
|---|---|---|
| 4,440,804 A | 4/1984 | Milgram |
| 4,512,848 A | 4/1985 | Deckman et al. |
| 4,521,445 A | 6/1985 | Nablo et al. |
| 4,576,900 A | 3/1986 | Chiang |
| 4,637,904 A | 1/1987 | Rounds |
| 4,676,868 A | 6/1987 | Riley et al. |
| 4,707,218 A | 11/1987 | Giammarco et al. |
| 4,731,155 A | 3/1988 | Napoli et al. |
| 4,737,425 A | 4/1988 | Lin et al. |
| 4,848,911 A | 7/1989 | Uchida et al. |
| 4,857,477 A | 8/1989 | Kanamori |
| 4,862,019 A | 8/1989 | Ashmore, Jr. |
| 4,866,307 A | 9/1989 | Ashmore, Jr. |
| 4,908,298 A | 3/1990 | Hefferon et al. |
| 4,919,748 A | 4/1990 | Bredbenner et al. |
| 4,921,778 A | 5/1990 | Thackeray et al. |
| 4,957,663 A | 9/1990 | Zwiers et al. |
| 4,959,252 A | 9/1990 | Bonnebat et al. |
| 4,964,945 A | 10/1990 | Calhoun |
| 4,980,316 A | 12/1990 | Huebner |
| 5,003,062 A | 3/1991 | Yen |
| 5,028,361 A | 7/1991 | Fujimoto |
| 5,028,366 A | 7/1991 | Harakal et al. |
| 5,053,318 A | 10/1991 | Gulla et al. |
| 5,073,230 A | 12/1991 | Maracas et al. |
| 5,110,514 A | 5/1992 | Soane |
| 5,124,089 A | 6/1992 | Ohkoshi et al. |
| 5,126,006 A | 6/1992 | Cronin et al. |
| 5,148,037 A | 9/1992 | Suda et al. |
| 5,151,754 A | 9/1992 | Ishibashi et al. |
| 5,212,147 A | 5/1993 | Sheats |
| 5,232,874 A | 8/1993 | Rhodes et al. |
| 5,240,550 A | 8/1993 | Boehnke et al. |
| 5,240,878 A | 8/1993 | Fitzsimmons et al. |
| 5,244,818 A | 9/1993 | Jokerst et al. |
| 5,246,880 A | 9/1993 | Reele et al. |
| 5,250,472 A | 10/1993 | Chen et al. |
| 5,259,926 A | 11/1993 | Kuwabara et al. |
| 5,288,436 A | 2/1994 | Liu et al. |
| 5,324,683 A | 6/1994 | Fitch et al. |
| 5,328,810 A | 7/1994 | Lowrey et al. |
| 5,330,881 A | 7/1994 | Sidman et al. |
| 5,362,606 A | 11/1994 | Hartney et al. |
| 5,362,940 A | 11/1994 | MacDonald et al. |
| 5,366,851 A | 11/1994 | Novembre |
| 5,371,822 A | 12/1994 | Horwitz et al. |
| 5,374,327 A | 12/1994 | Imahashi et al. |
| 5,376,810 A | 12/1994 | Hoenk et al. |
| 5,407,763 A | 4/1995 | Pai |
| 5,422,295 A | 6/1995 | Choi et al. |
| 5,424,549 A | 6/1995 | Feldman |
| 5,425,848 A | 6/1995 | Haisma et al. |
| 5,431,777 A | 7/1995 | Austin et al. |
| 5,434,107 A | 7/1995 | Paranjpe |
| 5,453,157 A | 9/1995 | Jeng |
| 5,458,520 A | 10/1995 | DeMercuio et al. |
| 5,468,542 A | 11/1995 | Crouch |
| 5,480,047 A | 1/1996 | Tanigawa et al. |
| 5,512,131 A | 4/1996 | Kumar et al. |
| 5,545,367 A | 8/1996 | Bae et al. |
| 5,601,641 A | 2/1997 | Stephens |
| 5,628,917 A | 5/1997 | MacDonald et al. |
| 5,643,364 A | 7/1997 | Zhao et al. |
| 5,654,238 A | 8/1997 | Cronin et al. |
| 5,669,303 A | 9/1997 | Maracas et al. |
| 5,736,424 A | 4/1998 | Prybyla et al. |
| 5,753,014 A | 5/1998 | Van Rijn |
| 5,772,905 A | 6/1998 | Chou |
| 5,776,748 A | 7/1998 | Singhvi et al. |
| 5,779,799 A | 7/1998 | Davis |
| 5,804,474 A | 9/1998 | Sakaki et al. |
| 5,808,742 A | 9/1998 | Everett et al. |
| 5,812,629 A | 9/1998 | Clauser |
| 5,817,579 A | 10/1998 | Ko et al. |
| 5,820,769 A | 10/1998 | Chou |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,926,690 A | 7/1999 | Toprac et al. |
| 5,948,470 A | 9/1999 | Harrison et al. |
| 5,948,570 A | 9/1999 | Kornblit et al. |
| 5,956,216 A | 9/1999 | Chou |
| 5,974,150 A | 10/1999 | Kaish et al. |
| 5,983,906 A | 11/1999 | Zhao et al. |
| 6,046,056 A | 4/2000 | Parce et al. |
| 6,048,799 A | 4/2000 | Prybyla |
| 6,067,144 A | 5/2000 | Murouchi |
| 6,074,827 A | 6/2000 | Nelson et al. |
| 6,128,070 A | 10/2000 | Peng |
| 6,150,231 A | 11/2000 | Muller et al. |
| 6,150,680 A | 11/2000 | Eastman et al. |
| 6,153,492 A | 11/2000 | Wege et al. |
| 6,180,239 B1 | 1/2001 | Whitesides et al. |
| 6,207,570 B1 | 3/2001 | Mucha |
| 6,218,316 B1 | 4/2001 | Marsh |
| 6,242,363 B1 | 6/2001 | Zhang |
| 6,274,294 B1 | 8/2001 | Hines |
| 6,274,393 B1 | 8/2001 | Hartswick |
| 6,284,653 B1 | 9/2001 | Tseng |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,348,999 B1 | 2/2002 | Summersgill et al. |
| 6,355,198 B1 | 3/2002 | Kim et al. |
| 6,376,379 B1 | 4/2002 | Quek et al. |
| 6,383,928 B1 | 5/2002 | Eissa |
| 6,387,783 B1 | 5/2002 | Furukawa et al. |
| 6,388,253 B1 | 5/2002 | Su |
| 6,391,217 B2 | 5/2002 | Schaffer et al. |
| 6,391,798 B1 | 5/2002 | DeFelice et al. |
| 6,423,207 B1 | 7/2002 | Heidari et al. |
| 6,482,742 B1 | 11/2002 | Chou |
| 6,495,907 B1 | 12/2002 | Jain et al. |
| 6,498,640 B1 | 12/2002 | Ziger |
| 6,503,829 B2 | 1/2003 | Kim et al. |
| 6,514,672 B2 | 2/2003 | Young et al. |
| 6,517,977 B2 | 2/2003 | Resnick et al. |
| 6,517,995 B1 | 2/2003 | Jacobson et al. |
| 6,518,189 B1 | 2/2003 | Chou |
| 6,521,536 B1 | 2/2003 | Robinson |
| 6,534,418 B1 | 3/2003 | Plat et al. |
| 6,541,360 B1 | 4/2003 | Plat et al. |
| 6,565,928 B2 | 5/2003 | Sakamoto et al. |
| 6,580,172 B2 | 6/2003 | Mancini et al. |
| 6,586,268 B1 | 7/2003 | Kopola et al. |
| 6,593,240 B1 | 7/2003 | Page |
| 6,606,149 B1 * | 8/2003 | Ogasawara et al. ............ 356/121 |
| 6,621,960 B2 | 9/2003 | Wang et al. |
| 6,627,544 B2 | 9/2003 | Izumi et al. |
| 6,629,292 B1 | 9/2003 | Corson et al. |
| 6,632,742 B2 | 10/2003 | Yang et al. |
| 6,635,581 B2 | 10/2003 | Wong |
| 6,646,662 B1 | 11/2003 | Nebashi et al. |
| 6,665,014 B1 | 12/2003 | Assadi et al. |
| 6,677,252 B2 | 1/2004 | Marsh |
| 6,678,038 B2 | 1/2004 | Binnard |
| 6,696,220 B2 | 2/2004 | Bailey et al. |
| 6,713,238 B1 | 3/2004 | Chou et al. |
| 6,713,843 B2 | 3/2004 | Fu |
| 6,716,754 B2 | 4/2004 | Hofmann et al. |
| 6,741,338 B2 | 5/2004 | McArthur et al. |
| 6,776,094 B1 | 8/2004 | Whitesides et al. |
| 6,805,054 B1 | 10/2004 | Meissl et al. |
| 6,809,356 B2 | 10/2004 | Chou |
| 6,828,244 B2 | 12/2004 | Chou |
| 6,833,325 B2 | 12/2004 | Huang et al. |
| 6,849,558 B2 | 2/2005 | Schaper |
| 6,873,087 B1 | 3/2005 | Choi et al. |
| 6,900,881 B2 | 5/2005 | Sreenivasan et al. |

(56) References Cited

U.S. PATENT DOCUMENTS

| | | |
|---|---|---|
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,936,194 B2 | 8/2005 | Watts |
| 6,946,360 B2 | 9/2005 | Chou |
| 6,951,173 B1 | 10/2005 | Meissl et al. |
| 6,954,275 B2 | 10/2005 | Choi et al. |
| 6,955,767 B2 | 10/2005 | Chen |
| 6,964,793 B2 | 11/2005 | Willson et al. |
| 6,980,282 B2 | 12/2005 | Choi et al. |
| 7,070,405 B2 | 7/2006 | Sreenivasan et al. |
| 7,071,088 B2 | 7/2006 | Watts et al. |
| 7,077,992 B2 | 7/2006 | Sreenivasan et al. |
| 7,117,583 B2 | 10/2006 | Dinan et al. |
| 7,128,875 B2 | 10/2006 | Cubicciotti |
| 7,136,150 B2 | 11/2006 | Sreenivasan et al. |
| 7,140,861 B2 | 11/2006 | Watts et al. |
| 7,214,624 B2 | 5/2007 | Fujita et al. |
| 7,244,386 B2 | 7/2007 | Sreenivasan et al. |
| 7,279,113 B2 | 10/2007 | Watts et al. |
| 7,292,326 B2 | 11/2007 | Nimmakayala et al. |
| 7,360,851 B1 | 4/2008 | Snyder |
| 7,762,186 B2* | 7/2010 | Meijer et al. ............... 101/368 |
| 7,780,893 B2 | 8/2010 | Sreenivasan et al. |
| 2001/0023829 A1 | 9/2001 | Olsson et al. |
| 2002/0038916 A1 | 4/2002 | Chiu et al. |
| 2002/0042027 A1 | 4/2002 | Chou et al. |
| 2002/0074562 A1 | 6/2002 | Suzuki et al. |
| 2002/0110992 A1 | 8/2002 | Ho |
| 2002/0111036 A1 | 8/2002 | Zhu et al. |
| 2002/0132482 A1 | 9/2002 | Chou |
| 2002/0150398 A1 | 10/2002 | Choi et al. |
| 2002/0167117 A1 | 11/2002 | Chou |
| 2002/0168578 A1 | 11/2002 | Wang et al. |
| 2002/0170880 A1 | 11/2002 | Chen |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0129542 A1 | 7/2003 | Shih et al. |
| 2003/0137494 A1 | 7/2003 | Tulbert |
| 2003/0174435 A1 | 9/2003 | Dinan et al. |
| 2003/0179354 A1 | 9/2003 | Araki et al. |
| 2003/0186140 A1 | 10/2003 | Fries |
| 2003/0197312 A1 | 10/2003 | Hougham et al. |
| 2003/0211671 A1 | 11/2003 | Blanchard |
| 2003/0224116 A1 | 12/2003 | Chen et al. |
| 2004/0036201 A1 | 2/2004 | Chou et al. |
| 2004/0046288 A1 | 3/2004 | Chou |
| 2004/0110856 A1 | 6/2004 | Young et al. |
| 2004/0112861 A1 | 6/2004 | Choi et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0146792 A1 | 7/2004 | Nimmakayala et al. |
| 2004/0156108 A1 | 8/2004 | Chou et al. |
| 2004/0168586 A1* | 9/2004 | Bailey et al. ............... 101/3.1 |
| 2004/0192041 A1 | 9/2004 | Jeong et al. |
| 2004/0197843 A1 | 10/2004 | Chou et al. |
| 2004/0201890 A1 | 10/2004 | Crosby |
| 2004/0212047 A1 | 10/2004 | Joshi et al. |
| 2004/0248383 A1 | 12/2004 | Weng et al. |
| 2004/0248384 A1 | 12/2004 | Kuo et al. |
| 2004/0250945 A1 | 12/2004 | Zheng et al. |
| 2005/0037143 A1 | 2/2005 | Chou et al. |
| 2005/0056963 A1 | 3/2005 | McCutcheon |
| 2005/0084804 A1 | 4/2005 | Truskett et al. |
| 2005/0110120 A1 | 5/2005 | Wang et al. |
| 2005/0158900 A1 | 7/2005 | Lee et al. |
| 2006/0019424 A1 | 1/2006 | Weng et al. |
| 2006/0022195 A1 | 2/2006 | Wang |
| 2006/0032437 A1* | 2/2006 | McMackin et al. ........... 118/100 |
| 2006/0050284 A1 | 3/2006 | Bertin-Mourot et al. |
| 2006/0062867 A1 | 3/2006 | Choi et al. |
| 2006/0067650 A1 | 3/2006 | Chui |
| 2006/0076717 A1 | 4/2006 | Sreenivasan et al. |
| 2006/0077374 A1 | 4/2006 | Sreenivasan et al. |
| 2006/0113697 A1 | 6/2006 | Sreenivasan |
| 2006/0266916 A1 | 11/2006 | Miller et al. |
| 2007/0026324 A1 | 2/2007 | Yoshida et al. |
| 2007/0026542 A1 | 2/2007 | Sreenivasan et al. |
| 2007/0054097 A1 | 3/2007 | Suehira et al. |
| 2007/0126156 A1 | 6/2007 | Mahadevan et al. |
| 2007/0176320 A1 | 8/2007 | Nakamura et al. |

FOREIGN PATENT DOCUMENTS

| | | |
|---|---|---|
| JP | 02-24848 | 1/1990 |
| JP | 02-92603 | 4/1990 |
| JP | 02192045 | 7/1990 |
| JP | 2005-533393 | 4/2005 |
| JP | 2007-103924 | 4/2007 |
| JP | 2007-230229 | 9/2007 |
| WO | WO 87/02935 | 5/1987 |
| WO | WO 98/10121 | 3/1998 |
| WO | WO 99/05724 | 2/1999 |
| WO | WO 99/45753 | 9/1999 |
| WO | WO 00/21689 | 4/2000 |
| WO | WO 01/47003 | 6/2001 |
| WO | WO 01/63361 | 8/2001 |
| WO | WO 01/69317 | 9/2001 |
| WO | WO 01/79589 | 10/2001 |
| WO | WO 01/79933 | 10/2001 |
| WO | WO 02/22916 | 3/2002 |
| WO | WO 02/24977 | 3/2002 |
| WO | 2007117519 | 10/2007 |

OTHER PUBLICATIONS

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. of SPIE, vol. 3676 Mar. 1, 1999.

Wu, Large Area High Density Quantized Magnetic Disks Fabricated Using Nanoimprint Lithography, J. Vac. Sci. Technol. B 16(6), pp. 3825-3829 Nov. 1, 1998.

Gokan et al., Dry Etch Resistance of Organic Materials, J. Electrochem. Soc.: Solid-State Science and Technology, pp. 143-146 Jan. 1, 1983.

Chou, Nanoimprint Lithography and Lithographically Induced Self-Assembly, MRS Bulletin, pp. 512-517 Jul. 1, 2001.

Braeuer et al., Precise Polymer Micro-Optical Systems, MRS Bulletin, pp. 519-522 Jul. 1, 2001.

Choi et al., Design of Orientation Stages for Step and Flash Imprint Lithography, Precision Engineering, pp. 192-199 Jan. 1, 2001.

Ruchhoeft et al., Patterning Curved Surfaces: Template Generation by Ion Beam Proximity Lithography and Relief Transfer by Step and Flash Imprint Lithography, Journal of Vacuum Science and Technology, pp. 1-17 Jan. 1, 2000.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Xia et al., Soft Lithography, Annu Rev. Mater Sci. 1998 28: 153-184 Jan. 1, 1998.

Chou et al., Imprint of Sub-25 nm Vias and Trenches in Polymers, Appl. Phys. Lett. 67 (21) Nov. 20, 1995.

Otto et al., Characterization and Application of a UV-based Imprint Technique, Microelectronic Engineering 57-58, pp. 361-366 Jan. 1, 2001.

(56) References Cited

OTHER PUBLICATIONS

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Otto et al., Reproducibility and Homogeneity in Step and Repeat UV-Nanoimprint Lithography, Microelectronic Engineering 73-74, pp. 152-156 Jan. 1, 2004.

Kawata et al., Imprint/Photo Hybrid Litography Using Conventional Contact Aligner, Japanese Journal of Applied Physics, vol. 43, No. 6B, pp. 4027-4030 Jun. 29, 2004.

Kim et al., Reducing Photocurable Polymer Pattern Shrinkage and Roughness during Dry Etching in Photo-Nanoimprint Litography, Japanese Journal of Applied Physics, vol. 43, No. 6B, pp. 4022-4026 Jun. 29, 2004.

Chou et al., Ultrafast and Direct Imprint of Nanostructures in Silicon, Nature, col. 417, (Jun. 2002), pp. 835-837 Jun. 1, 2002.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol. b. 19(6) Nov. 1, 2001.

Wilson et al., Lithography and Etch Issues, Handbook of Multilevel Metallization for Integrated Circuits, pp. 566-567 Jan. 1, 1993.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

McMackin et al., Design and Performance of a Step and Repeat Imprinting Machine, SPIE Microltihgraphy Conference Feb. 1, 2003.

Le et al., Development of an Etch-Definable Lift-Off Process for Use with Step and Flash Imprint Lithography, SPIE Microlithography Conference Feb. 1, 2005.

Cardinale et al., Fabrication of a Surface Acoustic Wave-Based Correlator Using Step-and-Flash Imprint Lithography, J. Vac. Sci. Technol. B 22(6) Nov. 1, 2004.

U.S. Appl. No. 11/242,628, naming Inventors Meissl et al., entitled An Assembly and Method for Transferring Imprint Lithography Templates, filed Oct. 3, 2005.

U.S. Appl. No. 11/314,957, naming Inventors Sreenivasan et al., entitled Step and Repeat Imprint Lithography Systems, filed Dec. 21, 2005.

Abstract of Japanese Patent 3-32888, Feb. 13, 1991.

Colburn et al., Dissertation for the Degree of Doctor of Philosophy, Step and Flash Imprint Lithography: A Low-Pressure, Room-Temperature Nanoimprint Lithography Aug. 1, 2001.

Abstract of Japanese patent 02-192045, Jul. 27, 1990.

Choi et al. Layer-to-Layer Alignment for Step and Flash Imprint Lithography; SPIE's 26th Intl. Symp. Microlithography: Emerging Lithographic Technologies; Mar. 1, 2002; Santa Clara, CA.

Bailey Imprint Template Advances and Surface Modification, and Defect Analysis for Step and Flash Imprint Lithography; Aug. 1, 2003.

* cited by examiner

TESSELLATED PATTERNS IN IMPRINT LITHOGRAPHY

This application for patent claims priority to U.S. Provisional Patent Application Ser. Nos. 60/788,807 and 60/862,480, which are hereby incorporated by reference herein.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms of 70NANB4H3012 awarded by National Institute of Standards (NIST) ATP Award.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention and all of which are incorporated by reference herein.

An imprint lithography technique disclosed in each of the aforementioned U.S. patent application publications and U.S. patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

DETAILED DESCRIPTION

Embodiments of the present invention are directed towards a choice of the shape of the patterned fields for Level 0 (patterned by imprint or photolithography or e-beam, etc.) and Level 1 (patterned by imprint) such that these shapes when tessellated together eliminate the open areas caused by the moats.

Figure 1:
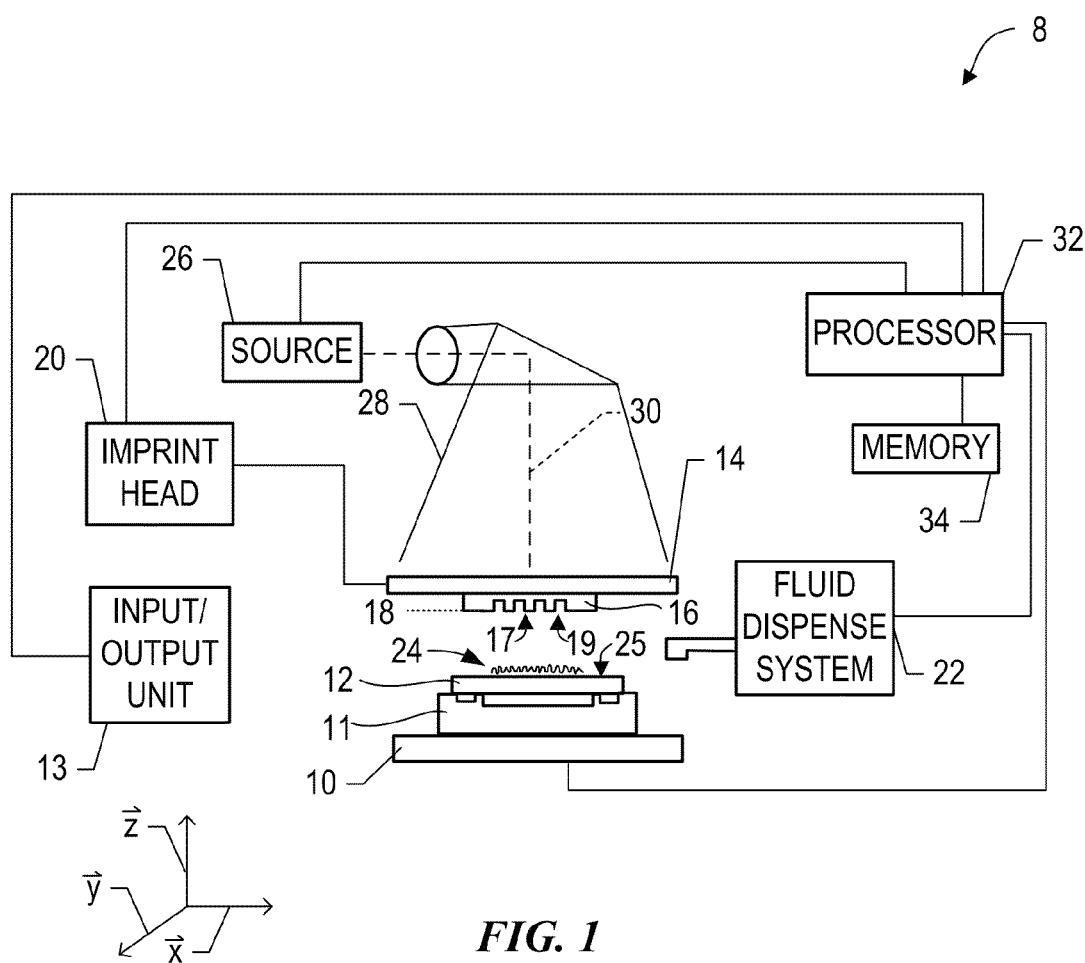
FIG. 1 is a simplified side view of a lithographic system having a template spaced-apart from a substrate.

Referring to FIG. 1, a system 8 to form a relief pattern on a substrate 12 includes a stage 10 upon which substrate 12 is supported and a template 14, having a patterning surface 18 thereon. In a further embodiment, substrate 12 may be coupled to a substrate chuck 11, the substrate chuck 11 being any chuck including, but not limited to, vacuum and electrostatic.

Template 14 and/or mold 16 may be formed from such materials including but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electrostatic. A fluid dispense system 22 is coupled to be selectively placed in fluid communication with substrate 12 so as to deposit polymerizable monomeric material 24 thereon. It should be understood that polymerizable monomeric material 24 may be deposited using any known technique, e.g., drop dispense, spin-coating, dip coating, chemical vapor deposition (CVD), physical vapor deposition (PVD), and the like.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume therebetween that is filled by polymerizable monomeric material 24.

Referring to FIG. 1, typically, polymerizable monomeric material 24 is disposed upon substrate 12 before the desired volume is defined between mold 16 and substrate 12. However, polymerizable monomeric material 24 may fill the volume after the desired volume has been obtained. After the desired volume is filled with polymerizable monomeric material 24, source 26 produces energy 28, e.g., broadband energy that causes polymerizable monomeric material 24 to solidify and/or cross-link conforming to the shape of a surface 25 of substrate 12 and patterning surface 18, defining a patterned layer on substrate 12.

The broadband energy may comprise an actinic component including, but not limited to, ultraviolet wavelengths, thermal energy, electromagnetic energy, visible light and the like. The actinic component employed is known to one skilled in the art and typically depends on the material from which imprinting layer 12 is formed. Control of this process is regulated by an input/output unit 13 and a processor 32 that is in data communication with stage 10, imprint head 20, fluid dispense system 22, source 26, operating on a computer readable program stored in memory 34.

The above-mentioned may be further be employed in imprint lithography processes and system referred to in U.S. Pat. No. 6,932,934 entitled "Formation of Discontinuous Films During an Imprint Lithography Process;" United States patent application publication 2004/0124566, filed as U.S. patent application Ser. No. 10/194,991 entitled "Step and Repeat Imprint Lithography Processes;" and United States patent application publication 2004/0188381, filed as U.S. patent application Ser. No. 10/396,615, entitled "Positive Tone Bi-Layer Imprint Lithography Method"; and United States patent application publication 2004/0211754, filed as U.S. patent application Ser. No. 10/432,642, entitled Method of Forming Stepped Structures Employing Imprint Lithography," all of which are incorporated by reference herein.

In imprint lithography, to achieve in-liquid alignment, regions (termed here as moats) that do not receive any imprint liquid may be established underneath the template alignment marks. This is because the imprint materials tend to be index matched with the template material and therefore do not image well if the liquid coats the under side of the template. If moats are used, then it could leave undesirable open areas in the printed wafer which could lead to etch and CMP loading problems at the edge of the field.

The present invention addresses the choice of the shape of the patterned fields for Level 0 (patterned by imprint or photolithography or e-beam, etc.) and Level 1 (patterned by imprint) such that these shapes when tessellated together eliminate the open areas causes by the moats.

FIGS. 2-6 define the shape of fields for level 0 and level 1 to avoid open areas while using moated regions with templates during in-liquid align. These kinds of shapes eliminate open areas at the interfaces of fields except perhaps for the open areas between fields shown in FIG. 5 that can be <10 um or even <1 um and are present to avoid making direct contact between a template and a previously cured imprint (previous field). If the gap is smaller than a micron, this should not cause significant etch or CMP loading. Further, use of S-FIL/R planarization, as described in U.S. patent application Ser. No. 10/396,615, entitled "Positive Tone Bi-Layer Imprint Lithography Method" should adequately cover these sorts of small open areas.

Figure 2:
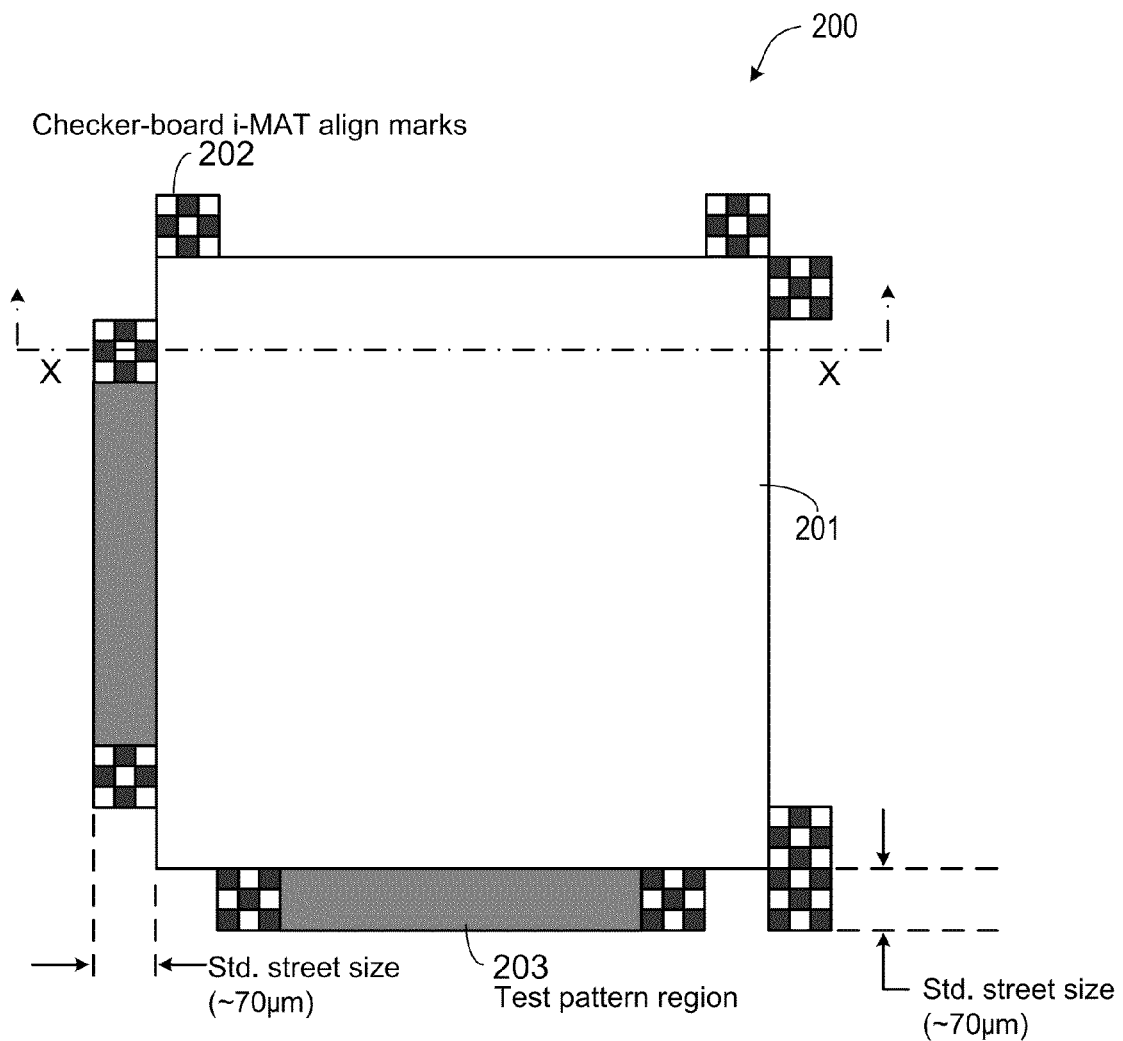
FIG. 2 illustrates a layer 0 field layout.
Figure 3:
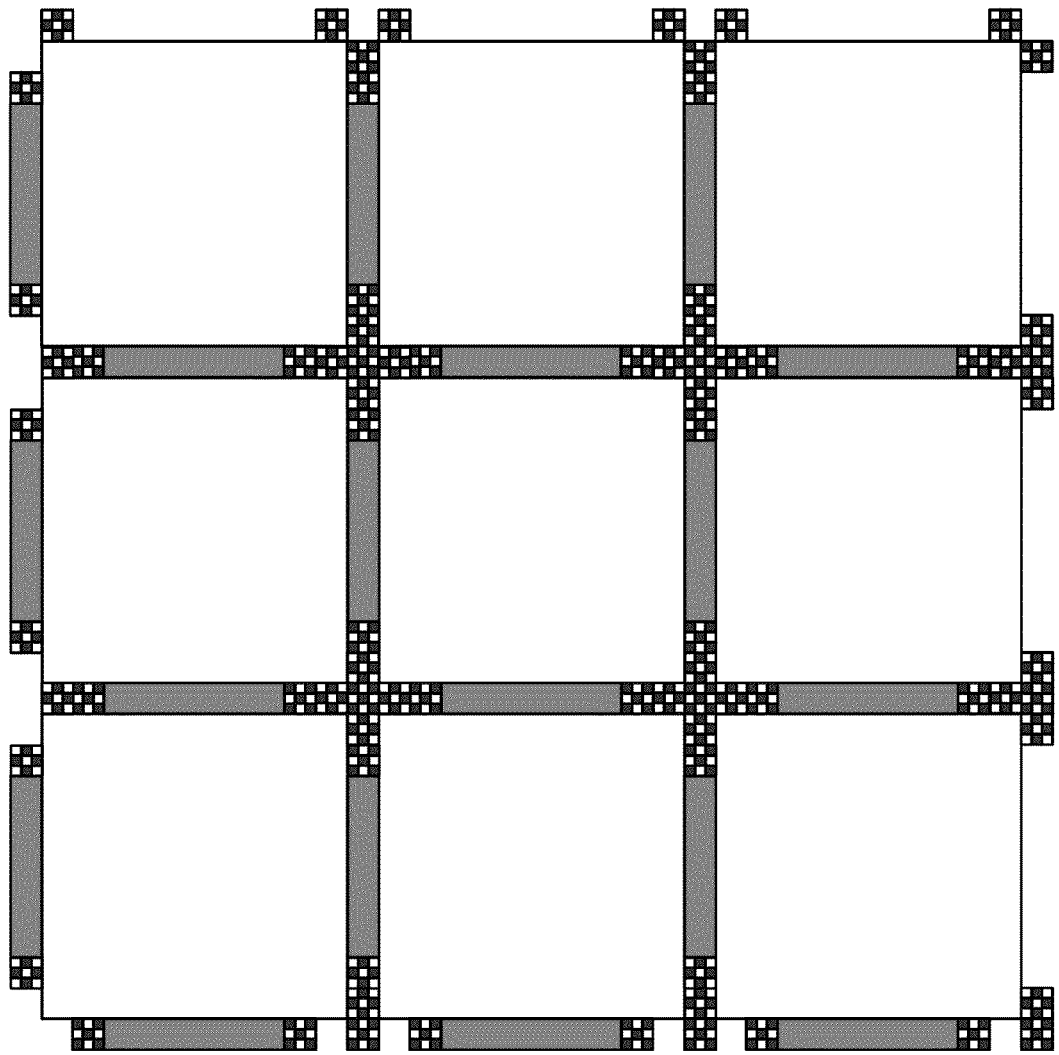
FIG. 3 illustrates a tessellated arrangement.

FIG. 2 shows a layer 0 field layout 200 and FIG. 3 shows a tessellated arrangement of such layouts. A wafer of such a tessellated pattern may be obtained using photolithography, imprint lithography, etc. The alignment marks 202 on level 1 may be checkered board marks as required for robust alignment schemes using inclined iMAT alignment system as described in U.S. patent application Ser. No. 11/000,331 entitled "Interferometric Analysis for the Manufacture of Nano-Scale Devices" and U.S. patent application Ser. No. 11/000,321 entitled "Interferometric Analysis Method for the Manufacture of Nano-Scale Devices," both of which are incorporated herein by reference. The number of alignment marks 202 can range from one to >16. Six of them allows measurement of linear correctable erros X, Y, Theta, Magx, Magy and Orthogonality errors. The test pattern region 203 is used to put test structures by customers that go through all the processing. These structures are eventually lost when the wafers 201 are diced to make chips. However, before dicing, they can measure process and device data from the test areas and use them to improve processes.

Figure 4A:
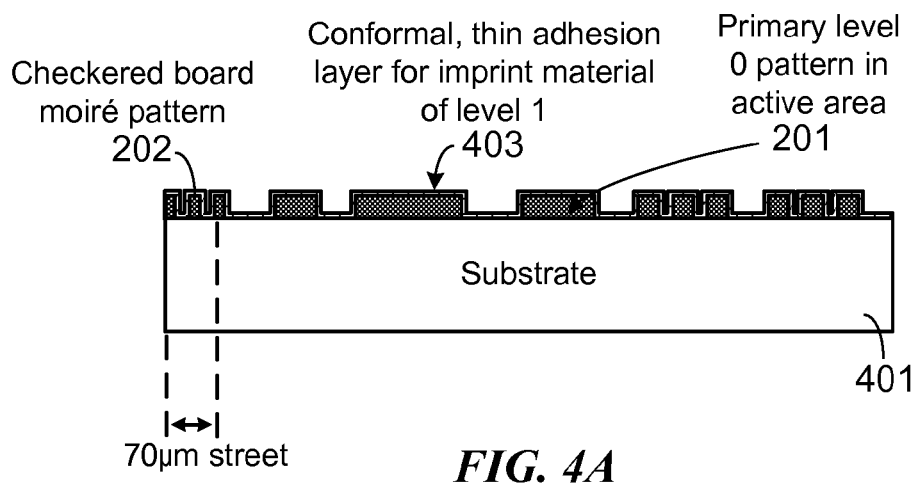
FIGS. 4A-4B illustrate a cross-section of field layout 200 of FIG. 2.
Figure 4B:
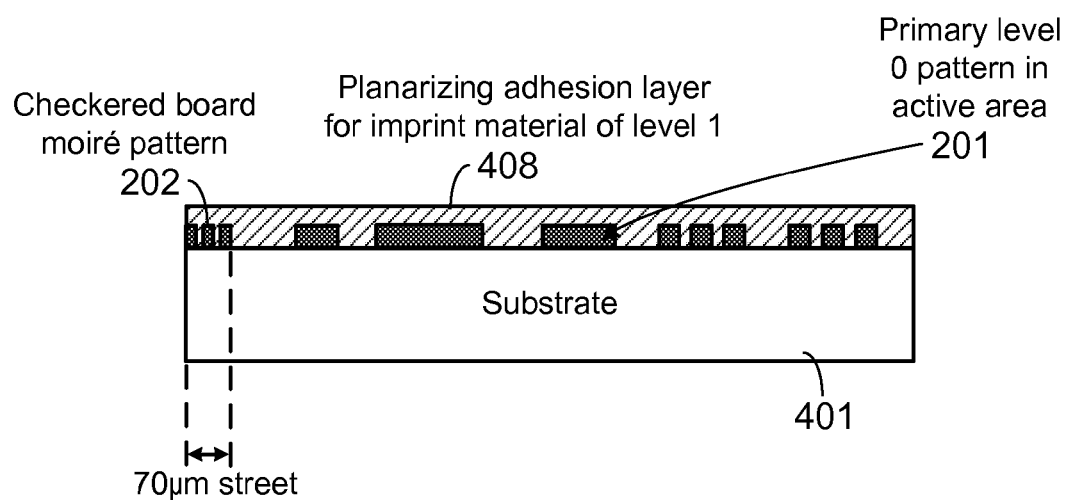

FIG. 4A illustrates a cross-section along line X-X of FIG. 2 of the wafer showing the checkerboard pattern 202 and an exemplary pattern in the active area 201, along with an adhesion layer 403 (conformal in this example) that is used for Level 1 imprinting. FIG. 4B illustrates the same cross-section as FIG. 4A, but with the addition of a planarizing adhesion layer 408 for imprint material of Level 1.

Figure 5:
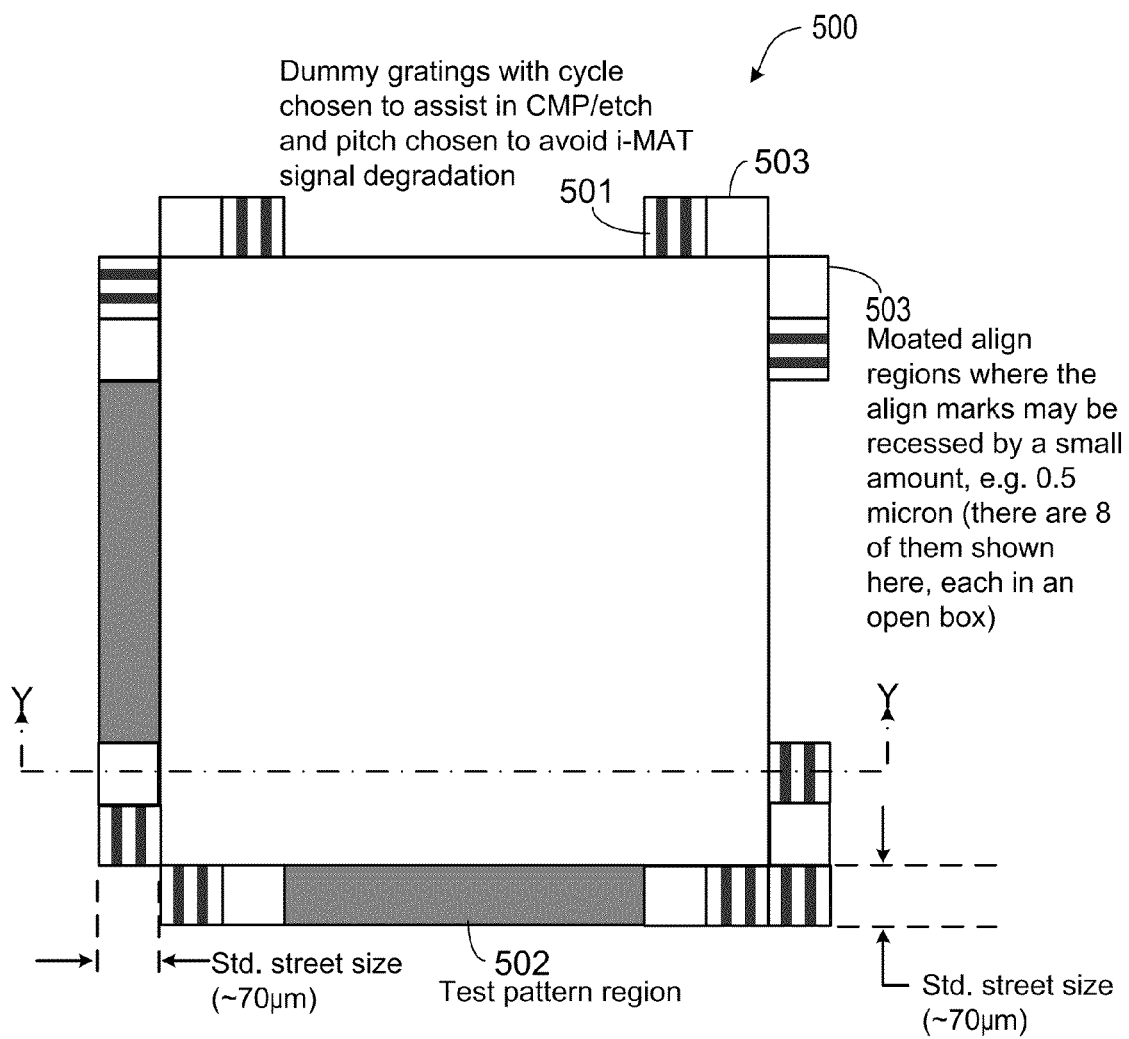
FIG. 5 illustrates a corresponding layer 1 field layout.

Referring to FIG. 5, shown is a layer 1 field layout 500 that corresponds to layout 200. The open boxes 503 (marked moated align regions) may contain gratings (see FIG. 6) as presented in the U.S. patent application Ser. No. 11/000,331 entitled "Interferometric Analysis for the Manufacture of Nano-Scale Devices" and U.S. patent application Ser. No. 11/000,321 entitled "Interferometric Analysis Method for the Manufacture of Nano-Scale Devices". These moated marks may also be recessed above the plane of the active patterns 602, and these marks will overlap the checkered board marks 202 shown in the level 0 layout 200, but the moated align marks 503 do not print. The layer 1 pattern layout 500 also includes the same number of regions as the moated align regions with the same total area to compensate for the non-printed area generated by the moated align marks. These areas—shown as "dummy gratings" areas 501—have gratings (or other similar repeating patterns) whose duty cycle is selected to provide appropriate loading for etch and CMP such that the total raised and recessed regions is nominally similar to that of the region surrounding the dummy patterns 501. Also, the pitch of the gratings is chosen so that they do not substantially interfere with the signal caused by the moated alignment marks 503 and the checkered board marks 202. As the level 1 wafer is printed, there will be some areas where the dummy gratings 505 that have already been printed (i.e., imprinted gratings 505 as shown in FIG. 7) will lie between the checkered board pattern of level 0 and the moated alignment mark patterns 503 described below. Therefore, the pitch of the dummy gratings is chosen to minimize the loss of signal quality in these locations.

Figure 6:
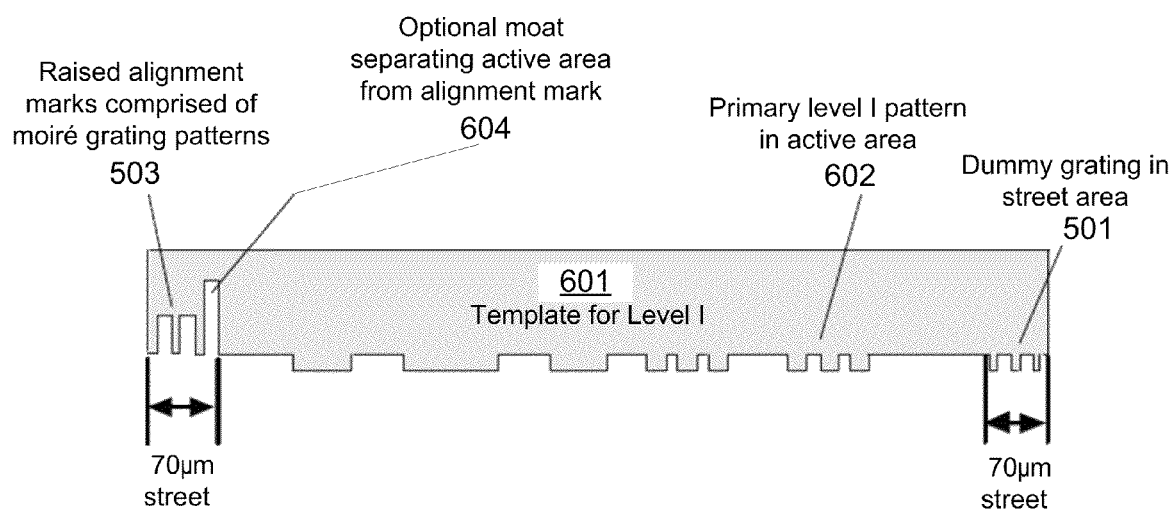
FIG. 6 illustrates a cross-section of template of FIG. 5.
Figure 7:
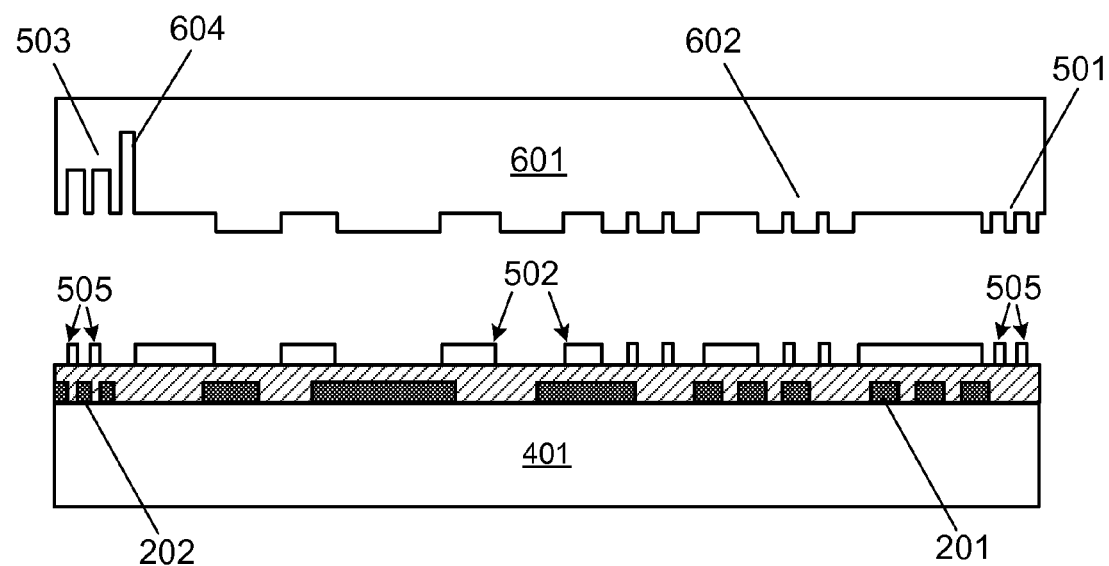
FIG. 7 illustrates the template of FIG. 6 in superimposition with a patterned layer on a substrate.

FIG. 6 illustrates a cross-section of template 601 corresponding to the layout 500 along cross-section Y-Y. FIG. 7 illustrates template 601 in superimposition with patterned layer 502 (primary level 1 pattern) formed over the level 0 pattern (see FIG. 4B). The template 601 includes a primary Level 1 pattern in an active area 602. An optional moat 604 region may be included for separating the active area 602 from the raised (i.e., recessed relative to the active area 602 surface) alignment marks 503. Also, raised alignment marks, while preferred, may not be needed. Since the monomer materials shrink by 5%-10% in the vertical direction due to UV cross-linking, this may provide a clearance, in some situations, that is sufficient without raising the alignment marks.

As shown in FIG. 6, template 601 may comprise a moat portion 604 positioned in an active area 602 that contains alignment marks. An example of a moat portion is also described in United States patent application publication 2006/0032437, filed as U.S. patent application Ser. No. 10/917,761, entitled "Moat System for an Imprint Lithography Template," which is incorporated by reference herein. The moat 604 may adversely affect longevity of the above-mentioned process. The moat 604 may trap polymerizable monomeric material 24 (see FIG. 1) and thus, potentially resulting in a site for contamination of template 14 with deteriorating imprint quality with successive imprints. The contamination may be minimized, if not prevented, by positioning alignment marks 503 off the mesa and recessed from the plane of the active area 602.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalent.

The invention claimed is:

1. An imprint lithography method for forming patterned fields without open areas between the fields, the method comprising:
   providing a substrate having a plurality of patterned fields formed thereon, each field having a first field layout, the first field layout having a first active area and a first boundary area having a plurality of first alignment marks, the first field layout further configured such that each field tessellates with each adjacent field;
   providing an imprint lithography template configured for imprinting a second field layout, the second field layout having a second active area and a second boundary area having a plurality of second alignment marks and a plurality of dummy grating areas, the second field layout further configured such that adjacent fields imprinted by the imprint lithography template tessellate with each other; and
   imprinting second field layouts over first field layouts using the imprint lithography template, wherein such imprinting further comprises imprinting dummy gratings over first alignment marks of first field layouts and wherein such imprinted dummy gratings do not interfere with the alignment of second alignment marks of the template with first alignment marks of the first pattern when imprinting adjacent second field layouts.

2. The method of claim 1 wherein the patterned fields are formed from a method selected from the group of: imprint lithography, photolithography, and e-beam lithography.

3. The method of claim 1 wherein the second active area of the template includes a plurality of features.

4. The method of claim 1 wherein the first alignment marks of the first field layout are checkerboard in design.

5. The method of claim 1 wherein the first boundary includes a test pattern region.

6. The method of claim 1 wherein the dummy grating areas have gratings having a pitch that does not substantially interfere with a signal caused by the alignment marks.

7. The method of claim 1 wherein the dummy grating areas each have gratings having a duty cycle nominally similar to that of features in a region surrounding the dummy grating area.

* * * * *